United States Patent
Lai et al.

(10) Patent No.: US 8,975,534 B2
(45) Date of Patent: Mar. 10, 2015

(54) FLEXIBLE BASE MATERIAL AND FLEXIBLE ELECTRONIC DEVICE

(75) Inventors: Li-Wen Lai, Taichung (TW); Kun-Wei Lin, Tainan (TW); Chun-Ting Chen, Taoyuan County (TW); Chun-Hao Chang, Tainan (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 305 days.

(21) Appl. No.: 13/338,081

(22) Filed: Dec. 27, 2011

(65) Prior Publication Data

US 2012/0292084 A1 Nov. 22, 2012

(30) Foreign Application Priority Data

May 16, 2011 (TW) .............................. 100117018 A

(51) Int. Cl.
| H05K 1/16 | (2006.01) |
| H05K 1/18 | (2006.01) |
| H05K 1/03 | (2006.01) |
| H01L 51/00 | (2006.01) |
| H01L 51/52 | (2006.01) |
| H05K 1/02 | (2006.01) |

(52) U.S. Cl.
CPC .............. *H05K 1/189* (2013.01); *H05K 1/0271* (2013.01); *H05K 1/185* (2013.01); *H05K 2201/0162* (2013.01); *H05K 1/0393* (2013.01); H05K 2201/10106 (2013.01); *H01L 51/0097* (2013.01); *H01L 51/5253* (2013.01); *Y02E 10/549* (2013.01)

USPC .......................................... 174/260; 174/258

(58) Field of Classification Search
USPC .................. 174/260, 250, 255, 256, 258, 268
See application file for complete search history.

(56) References Cited

U.S. PATENT DOCUMENTS

| 6,268,695 | B1 | 7/2001 | Affinito |
| 6,413,645 | B1 | 7/2002 | Graff |
| 7,473,853 | B2* | 1/2009 | Murai et al. ................... 174/260 |
| 7,492,091 | B2 | 2/2009 | Kharrazi-Olsson |
| 8,455,041 | B2* | 6/2013 | Schaepkens et al. ........... 427/66 |
| 2003/0118796 | A1* | 6/2003 | Jeong et al. ................... 428/200 |
| 2005/0260395 | A1 | 11/2005 | Schaepkens et al. |
| 2010/0110623 | A1* | 5/2010 | Koyama et al. .......... 361/679.01 |

OTHER PUBLICATIONS

Office Action from corresponding Taiwanese Application No. 100117018, issued Jan 9, 2014.

* cited by examiner

*Primary Examiner* — Tremesha S Willis
(74) *Attorney, Agent, or Firm* — Muncy, Geissler, Olds & Lowe, P.C.

(57) ABSTRACT

The invention provides a flexible base material and a flexible electronic device. The flexible base material includes a flexible substrate having a first surface and a second surface opposite to the first surface. A first organic composite barrier layer is deposited on the first surface of the flexible substrate, wherein the first organic composite barrier layer applies a first stress to the flexible substrate. An anti-curved layer is deposited on the second surface of the flexible substrate, wherein the anti-curved layer applies a second stress to the flexible substrate, and wherein the second stress applied by the anti-curved layer cancels off more than 90% of the first stress.

9 Claims, 6 Drawing Sheets

FLEXIBLE BASE MATERIAL AND FLEXIBLE ELECTRONIC DEVICE

CROSS REFERENCE TO RELATED APPLICATIONS

This application claims priority of Taiwan Patent Application No. 100117018, filed on May 16, 2011, the entirety of which is incorporated by reference herein.

BACKGROUND

1. Field of the Disclosure

The present disclosure relates to a flexible base material and a flexible electronic device, and in particular, to a flexible base material and a flexible electronic device with excellent moisture-barrier/gas-barrier and anti-curving performances.

2. Description of the Related Art

In recent years, flexible electronic devices have been developed. For example, an organic light emitting diode device (OLED) has the advantages of being self-luminous, light weight, and thin and having low power consumption. Compared with the conventional fluorescent lamp having a linear luminous body and the light emitting diode device (LED) having a spot-shaped luminous body, an OLED has a planar luminous body, and has replaced the fluorescent lamp. Also, laminating materials of OLEDs are flexible organic materials with the advantages of having high contrast, fast response time and a wide viewing-angle. The flexible OLED display, which is fabricated by forming OLEDs and organic thin film transistors for driving the OLEDs on a plastic substrate, has become the choice of preference for replacing the conventional rigid display. The flexible OLED display generally uses a plastic substrate as a substrate. However, the plastic substrate has poor moisture-barrier/gas-barrier performance. Also, organic light emitting polymer layers and high activity electrode materials in the flexible OLED display are very sensitive to moisture and oxygen. When moisture and oxygen in the atmosphere penetrate into the plastic substrate, the luminance of the OLED is reduced, and the driving voltage is increased, such that a dark spot problem and short circuit problem may occur, thereby decreasing the reliability and life span of the flexible OLED display. Therefore, developments in packaging technology are very important to the technology of the flexible OLED display.

The conventional moisture-barrier/gas-barrier technology uses an organic-inorganic alternating multilayer as a barrier layer formed on the flexible substrate by a sputtering or plasma enhanced chemical vapor deposition (PECVD) method to achieve the moisture-barrier/gas-barrier performance. However, the conventional barrier layer requires laminating at least three pairs of the organic-inorganic alternating multilayer to achieve the moisture-barrier/gas-barrier function. Also, the conventional organic-inorganic alternating multilayer is formed by alternate delivery and sputtering processes in different vacuum chambers. Thus, the fabrication cost and process time are increased. Further, after the barrier layer is sputtered on the flexible substrate, the internal stress in the barrier layer affects the flexible substrate, resulting in the bending or deformation of the substrate, thus, negatively affecting the moisture-barrier/gas-barrier performance of the conventional barrier layer.

BRIEF SUMMARY

A flexible base material and a flexible electronic device are provided. An exemplary embodiment of a flexible base material comprises a flexible substrate having a first surface and a second surface opposite to the first surface. A first organic composite barrier layer is deposited on the first surface of the flexible substrate, wherein the first organic composite barrier layer applies a first stress to the flexible substrate. An anti-curved layer is deposited on the second surface of the flexible substrate, wherein the anti-curved layer applies a second stress to the flexible substrate, and wherein the second stress applied by the anti-curved layer cancels off more than 90% of the first stress.

An exemplary embodiment of a flexible electronic device comprises a flexible base material comprising a flexible substrate having a first surface and a second surface opposite to the first surface. A first organic composite barrier layer is deposited on the first surface of the flexible substrate, wherein the first organic composite barrier layer applies a first stress to the flexible substrate. An anti-curved layer is deposited on the second surface of the flexible substrate, wherein the anti-curved layer applies a second stress to the flexible substrate, and wherein the second stress applied by the anti-curved layer cancels off more than 90% of the first stress. A flexible electronic component is deposited on the first organic composite layer. A second organic composite barrier layer is deposited on the flexible electronic component, encapsulating the flexible electronic component.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION

Figure 1:
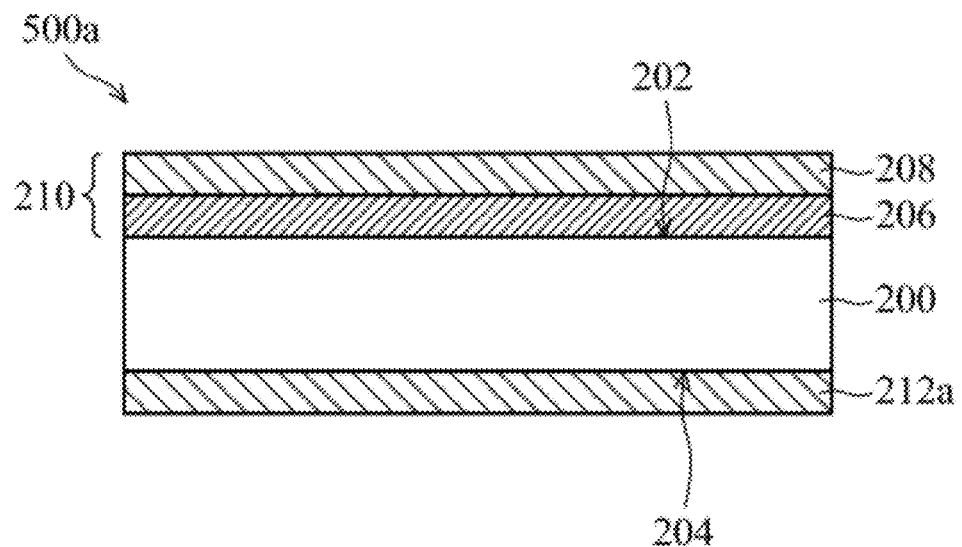
FIG. 1 is a cross section showing one exemplary embodiment of a flexible base material of the disclosure.

The following description is of a mode for carrying out the exemplary embodiments. This description is made for the purpose of illustrating the general principles of the disclosure and should not be taken in a limiting sense. The scope of the disclosure is best determined by reference to the appended claims. Wherever possible, the same reference numbers are used in the drawings and the descriptions to refer the same or like parts.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the disclosure.

FIG. 1 is a cross section showing one exemplary embodiment of a flexible base material 500a of the disclosure. The flexible base material 500a comprises a flexible substrate 200 having a first surface 202 and a second surface 204 opposite to the first surface. An organic composite barrier layer 210 is deposited on the first surface of the flexible substrate. An anti-curved layer 212a is deposited on the second surface 204 of the flexible substrate 200.

In one embodiment, the flexible substrate 200 may comprise organic materials of pet polyethylene terephthalate (PET), polyethersulfone (PES), polyethylene naphthalate (PEN), polyimide (PI), polycarbonate (PC), and etc. In one embodiment, the organic composite barrier layer 210 is used to block penetration by moisture and oxide from the outside environment. The first organic composite barrier layer 210 may comprise organic materials having an $Si\text{-}(CH_3)_x$ or $Si\text{-}(CH_2)_x$ bond. Additionally, the organic composite barrier layer 210 may by a composite structure formed by laminating of a first organic layer 206 and a second organic layer 208. The first organic layer 206 is deposited between flexible substrate 200 and the second organic layer 208. In one embodiment, the anti-curved layer 212a is used to balance the stress generated by growing the organic composite layer. Therefore, the resulting organic composite barrier layer may have good film characteristics. Thus, the moisture-barrier/gas-barrier performance of the organic composite barrier layer 210 is improved. The anti-curved layer 212a may comprise a signal layer formed by silicon oxide ($SiO_x$), silicon nitride ($SiN_x$), oxinitride nitride ($SiO_xN_y$), organic materials or metal oxides. Thicknesses of the anti-curved layer 212a and the first organic layer 206 and the second organic layer 208 of the organic composite barrier layer 210 are accordingly to requirements, respectively, wherein a stress applied by the organic composite barrier layer 210 to the flexible substrate 200 is substantially cancelled off by a stress applied by the anti-curved layer 212a to the flexible substrate 200. For example, the stress applied by the organic composite barrier layer 210 to the flexible substrate 200 is cancelled off by more than 90% of the stress applied by the anti-curved layer 212a to the flexible substrate 200.

A method for fabricating one exemplary embodiment of a flexible base material 500a is described as follows. First, a flexible substrate 200 is provided. Next, an anti-curved layer 212a is formed on a second surface 204 of the flexible substrate 200 by a PECVD method. A thickness of the anti-curved layer 212a is between about 5 nm and 5 μm. In one embodiment, a radio-frequency (RF) power for forming the anti-curved layer 212a is between about 1000 watt and 2000 watt. Next, a first surface 202 of the flexible substrate 200 is cleaned using plasma bombarding only with the introduction of Ar by another PECVD method. Next, Ar and a thermal vapor of vaporized hexamethyldisiloxane ($Si_2OC_6H_{18}$, HMDSO) are introduced into the vacuum chamber of a PECVD apparatus without $O_2$. Another PECVD method is performed to heat and dissociate the precursor HMDSO, so that a first organic layer 206 of the organic composite barrier layer 210 is formed on the first surface 202 of the flexible substrate 200. A thickness of the first organic layer 206 is between 1 nm and 10 μm. A molecular formula of HMDSO is shown as Equation (1):

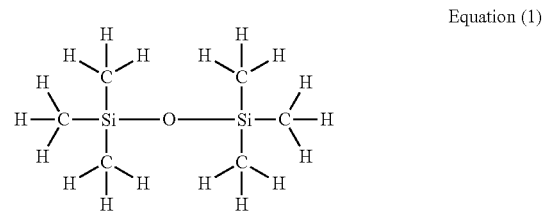

Equation (1)

In one embodiment, the plasma dissociation equation for forming the first organic layer 206 is shown as Equation (2):

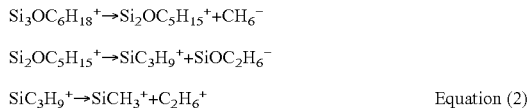

Equation (2)

Also, dissociation elements of the first organic layer 206 are shown as Equation (3):

Equation (3)

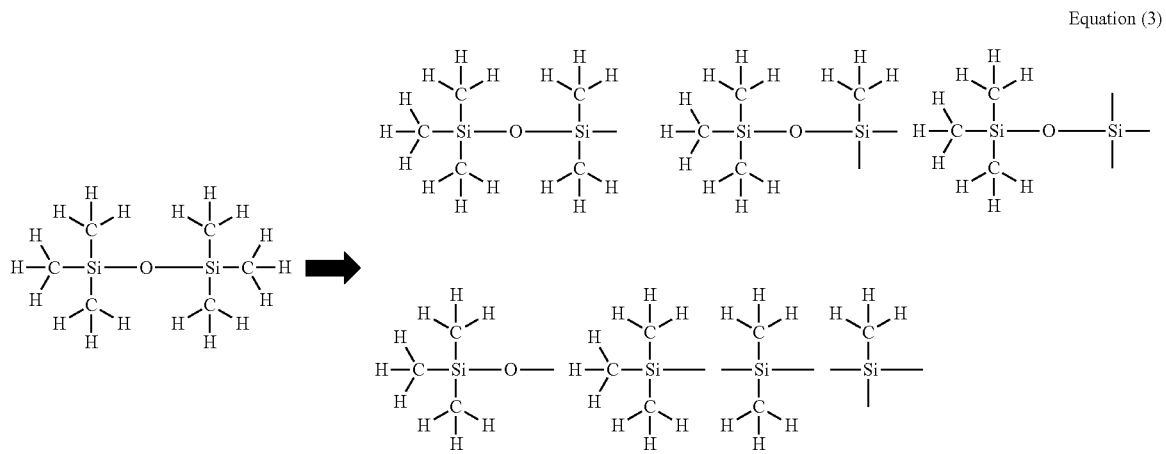

From equations (2) and (3), in one embodiment, the first organic layer 206 may comprise ions of organosilicon compounds including $SiOC_2H_6^-$, $SiCH_3^+$ or $C_2H_6^-$. The first organic layer 206 may contain a huge amount of $SiCH_3$ and $Si\text{—}(CH_3)_x$ (x=2~4) bonds in the film without being dissociated by plasma. Therefore, the formed first organic layer 206 may be an organic film containing Si—(CH$_3$)$_x$ (x=1~4) bond. The first organic layer 206 may further comprise an Si—O—Si bond, and a ratio of the Si—O—Si bond to the Si—(CH$_3$)$_x$ bond is smaller than 1 or equal to 1. After forming the first organic layer 206, another PECVD method is performed, and a mixed gas of Ar, O$_2$ and an HMDSO thermal vapor is introduced into the vacuum chamber, thereby forming the second organic layer 208 of the organic composite barrier layer 210 on the first organic layer 206. In one embodiment, the plasma dissociation equation for forming the second organic layer 208 is equal to that for forming the first organic layer 206. Dissociation elements of the second organic layer 208 are shown as Equation (4):

but according to design. In one exemplary embodiment of the anti-curved layer 212a, the first organic layer 206 and the second organic layer 208 may be continuously formed in the same vacuum chamber, wherein the process parameters of these layers are shown in Table 1.

TABLE 1

|  | the anti-curved layer | the first organic layer | the second organic layer |
| --- | --- | --- | --- |
| HMDSO flow rate | 7 sccm | 7 sccm | 7 sccm |
| oxygen flow rate | 170 sccm | — | 70 sccm |

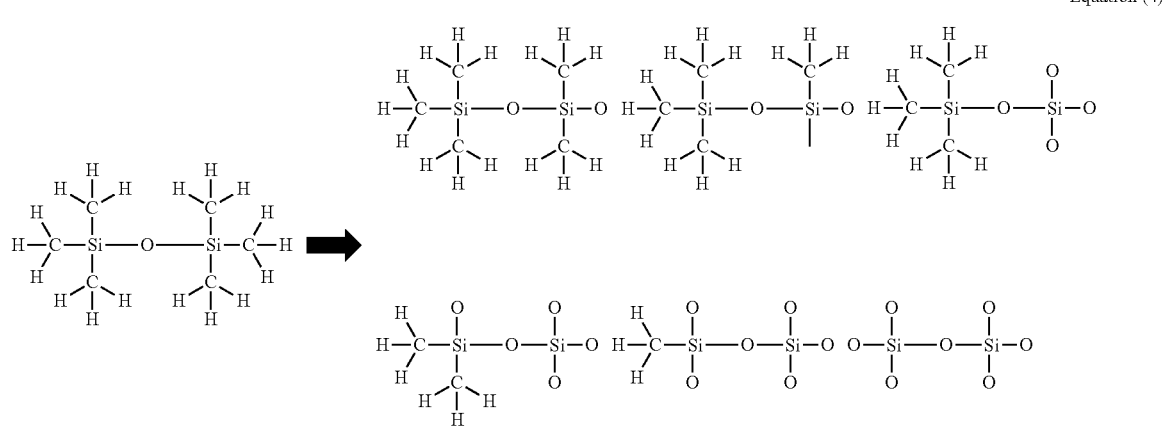

Equation (4)

It is noted that the plasma power for forming the second organic layer 208 is much larger than that for forming the first organic layer 206. After dissociating HMDSO, more Si—CH$_3$ bonds are broken, and every oxygen atom is bonded to two Si atoms, which are formed after breaking the Si—CH$_3$ bonds, to make the Si—O—Si bonds. Therefore, from Equation (4), the second organic layer 208 may contain Si—O—Si, SiCH$_3$ or Si—(CH$_3$)$_x$ (x=2~4) bonds therein, and a number of Si—O—Si bonds in the second organic layer 208 is more than that in the first organic layer 206. Therefore, a ratio of the Si—O—Si bond to the Si—(CH$_3$)$_x$ bond is larger than 1. A thickness of the second organic layer 208 is between about 5 nm and 1 μm. In one embodiment, the anti-curved layer 212a is used to balance the stress from the organic composite barrier layer 210 deposited on another side of the flexible substrate 200. The film stress relates to a thickness of the film. Therefore, a thickness ratio of the anti-curved layer 212a to the organic composite barrier layer 210 is required to be within a certain range to achieve a goal of stress balance. In one embodiment, a thickness ratio of the anti-curved layer 212a to the organic composite barrier layer 210 may be between 0.1 and 3. In one embodiment, RF power for forming the first organic layer 206 is between about 100 watt and 800 watt, and a RF power for forming the second organic layer 208 is between about 1000 watt and 1800 watt. After forming the first organic layer 206 and the second organic layer 208, one exemplary embodiment of a flexible base material 500a having the organic composite barrier layer 210 constructed by a pair of organic layers (comprising the first organic layer 206 and the second organic layer 208) is formed completely. Alternatively, the number of layers of the organic composite barrier layer 210 is not limited to the numbers stated above, TABLE 1-continued

|  | the anti-curved layer | the first organic layer | the second organic layer |
| --- | --- | --- | --- |
| argon (Ar) flow rate | 100 sccm | 16 sccm | 100 sccm |
| temperature | room temperature | room temperature | room temperature |
| chamber pressure | 44 mTorr | 40 mTorr | 44 mTorr |
| Plasma power | 1000~2000 W | 100~800 W | 1000~1800 W |

Figure 2:
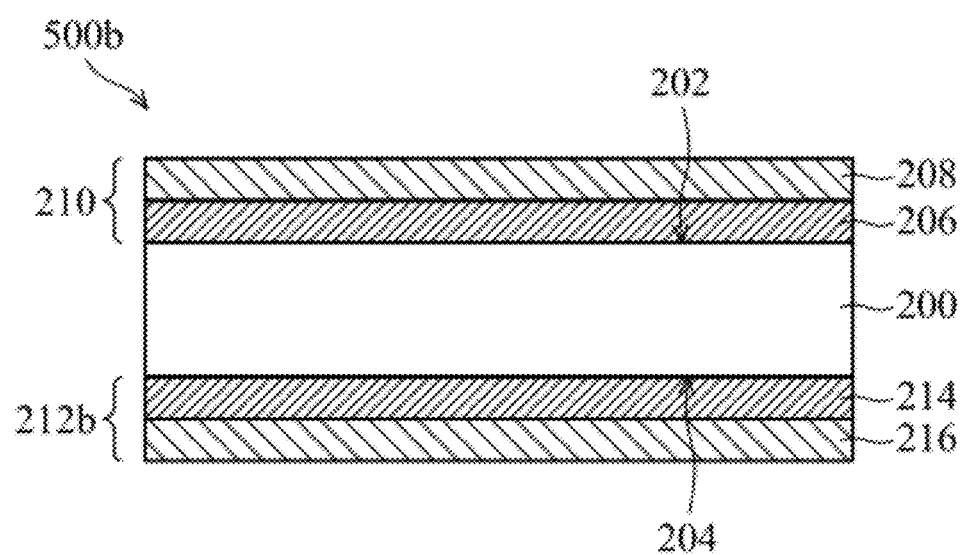
FIG. 2 is a cross section showing another exemplary embodiment of a flexible base material of the disclosure.

FIG. 2 is a cross section showing another exemplary embodiment of a flexible base material 500b of the disclosure. In another embodiment, another organic composite barrier layer may serve as an anti-curved layer 212b deposited on the second surface 204 of the flexible substrate 200. As shown in FIG. 2, the anti-curved layer 212b is an organic composite structure constructed by laminating a third organic layer 214 and a fourth organic layer 216 to the flexible substrate 200, wherein the third organic layer 214 is deposited between the flexible substrate 200 and the fourth organic layer 216. In one embodiment, the third organic layer 214 and the first organic layer 206 may be formed by the same materials and have the same thickness. Also, the fourth organic layer 216 and the second organic layer 208 may be formed by the same materials and have the same thickness. The anti-curved layer 212b deposited on the second surface 204 of the flexible substrate 200 and the organic composite barrier layer 210 deposited on the first surface 202 of the flexible substrate 200 are symmetric to each other and formed by the same materials. Therefore, a stress applied by the organic composite barrier layer 210 to the flexible substrate 200 is substantially cancelled off by a stress applied by the anti-curved layer 212b to the flexible substrate 200. For example, the stress applied by the organic composite barrier layer 210 to the flexible substrate 200 is cancelled off by more than 90% of the stress applied by the anti-curved layer 212b to the flexible substrate 200. In other embodiments, the number of layers of the organic composite barrier layer 210 and the anti-curved layer 212b are not limited to the numbers stated above, but according to design.

Figure 4:
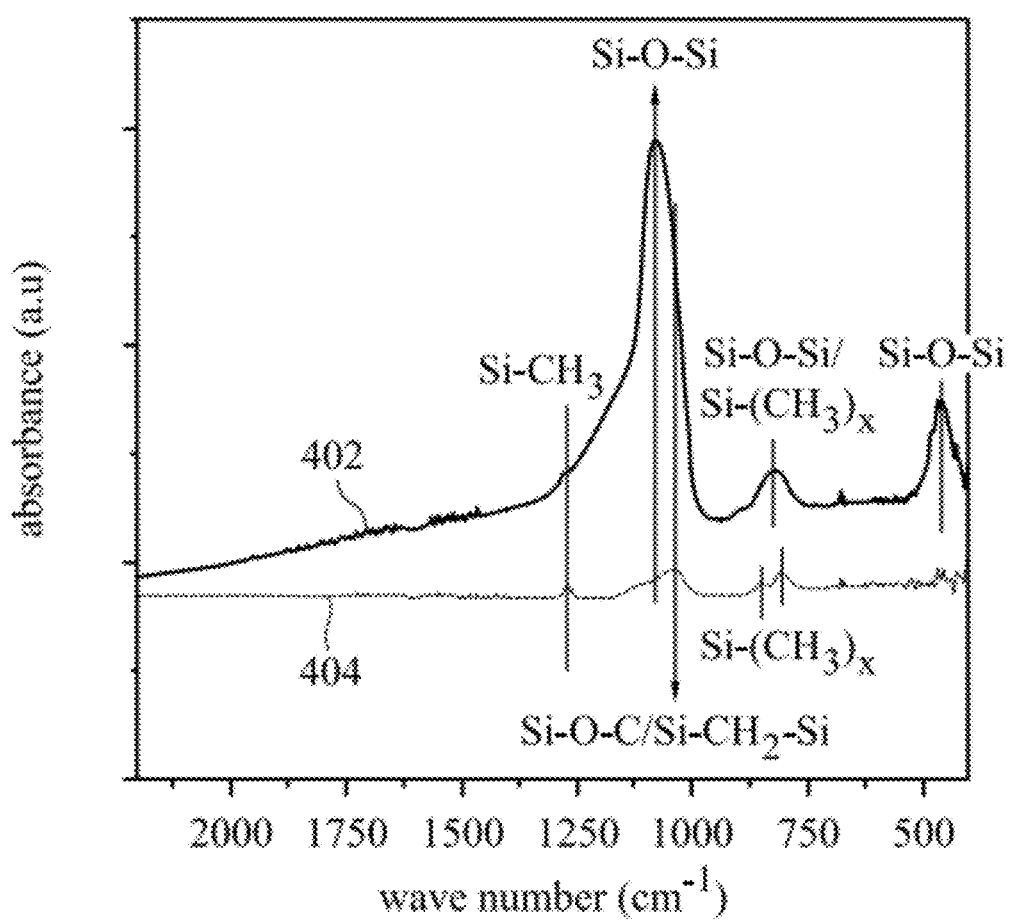
FIG. 4 is a Fourier transform infrared spectroscopy (FTIR) analysis diagram of a first organic layer and a second organic layer of a first organic composite barrier layer of one exemplary embodiment of a flexible base material of the disclosure.

FIG. 4 is a Fourier transform infrared spectroscopy (FTIR) analysis diagram of the first organic layer 206 and the second organic layer 208 of a first organic composite barrier layer of one exemplary embodiment of a flexible base material of the disclosure. Referring to FIG. 4, an FTIR signal 404 of the first organic layer 206 contains an Si—O—C/Si—$CH_2$—Si bond (1038 $cm^{-1}$), Si—$CH_3$ bond (1260 $cm^{-1}$) and Si—$(CH_3)_x$ bond (840 $cm^{-1}$). Also, an FTIR signal 402 of the second organic layer 208 contains an Si—O—Si bond (1072 $cm^{-1}$), Si—$CH_3$ bond (1260 $cm^{-1}$) and Si—$(CH_3)_x$ bond (840 $cm^{-1}$). Because oxygen is not introduced into the vacuum chamber during the growing the first organic layer 206 (as show in Table 1), a ratio of the Si—O—Si bond to the Si—$(CH_3)_x$ bond of the first organic layer 206 is smaller than 1 or equal to 1 (the Si—O—Si bond is provided by dissociating HMDSO). Because the vacuum chamber is introduced a huge amount of oxygen during the growing of the second organic layer 208 (as show in Table 1), the second organic layer 208 is an oxygen-rich organic film having a high Si—O—Si bond content, and a ratio of the Si—O—Si bond to the Si—$(CH_3)_x$ bond of the first organic layer 206 is larger than 1. As shown in FIG. 4, a signal intensity of the Si—O—Si bond in the second organic layer 208 is larger than that in the first organic layer 206. That is to say, the second organic layer 208 has a higher $SiO_x$ component than the first organic layer 206.

Figure 5:
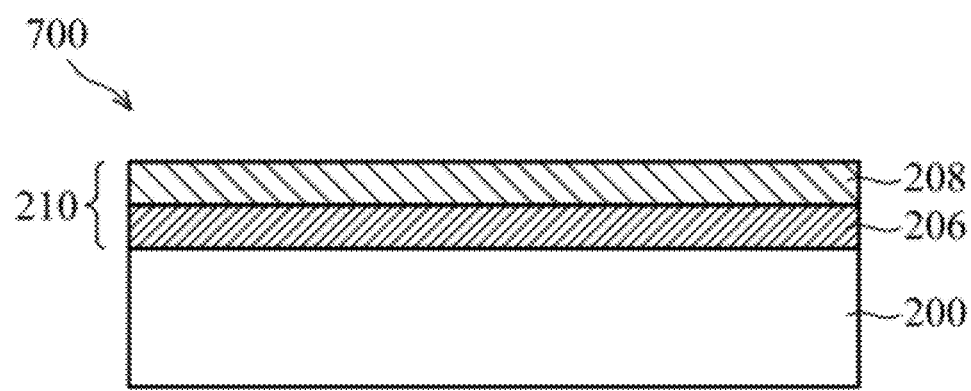
FIG. 5 is a cross section showing one comparative example of a flexible base material of the disclosure.

FIG. 5 is a cross section showing one comparative example of a flexible base material 700 of the disclosure. The differences between the comparative example of the flexible base material 700 as shown in FIG. 5 and the one exemplary embodiment of the flexible base material 500a as shown in FIG. 1 is that the flexible base material 700 does not have an anti-curved layer, wherein the other elements of the flexible base material 700 are the same as that of the flexible base material 500a.

Figure 6A:
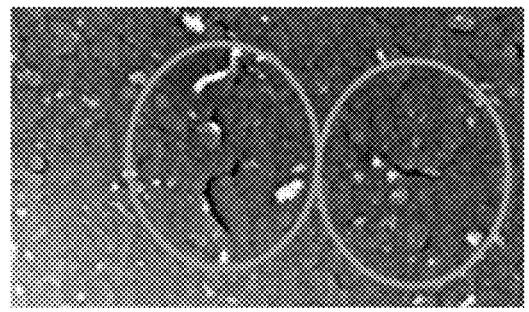
FIGS. 6a and 6b are secondary electron microscope images of one exemplary embodiment of a flexible base material and one comparative example of a flexible base material, showing surface statuses of the both.
Figure 6B:
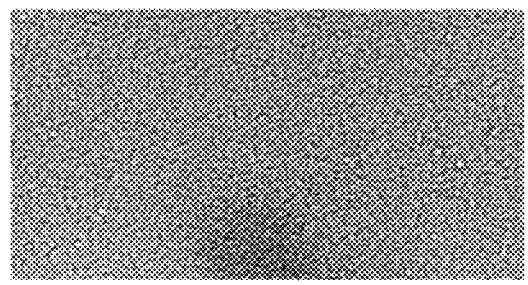

FIGS. 6a and 6b are secondary electron microscope (SEM) images of one exemplary embodiment of a flexible base material 500a as shown in FIG. 1 and one comparative example of a flexible base material 700 as shown in FIG. 5, showing surface statuses of the both. The magnification of the SEM images as shown in FIGS. 6a and 6b is 50000. As shown in FIG. 6a, the second organic layer 208 (the oxygen-rich organic film) of the organic composite barrier layer 210 of the flexible base material 700 without the anti-curved layer had the occurrence of small cracks (as shown in the region surrounded by a circular ring). These cracks provide paths for moisture penetration. Therefore, the flexible base material 700 has poor moisture-barrier/gas-barrier performance, and the measured water vapor transmission rates (WVTR) of the flexible base material 700 were only 0.4 $g/m^2$/day. As shown in FIG. 6b, the second organic layer 208 of the organic composite barrier layer 210 of the flexible base material 500a did not have any cracks in the same magnification of the SEM image to the flexible base material 700 as shown in FIG. 6a. Therefore, the flexible base material 500a had good moisture-barrier/gas-barrier performance when compared to the flexible base material 700, and the measured WVTR of the flexible base material 500a were only $10^{-6}$ $g/m^2$/day.

Figure 7:
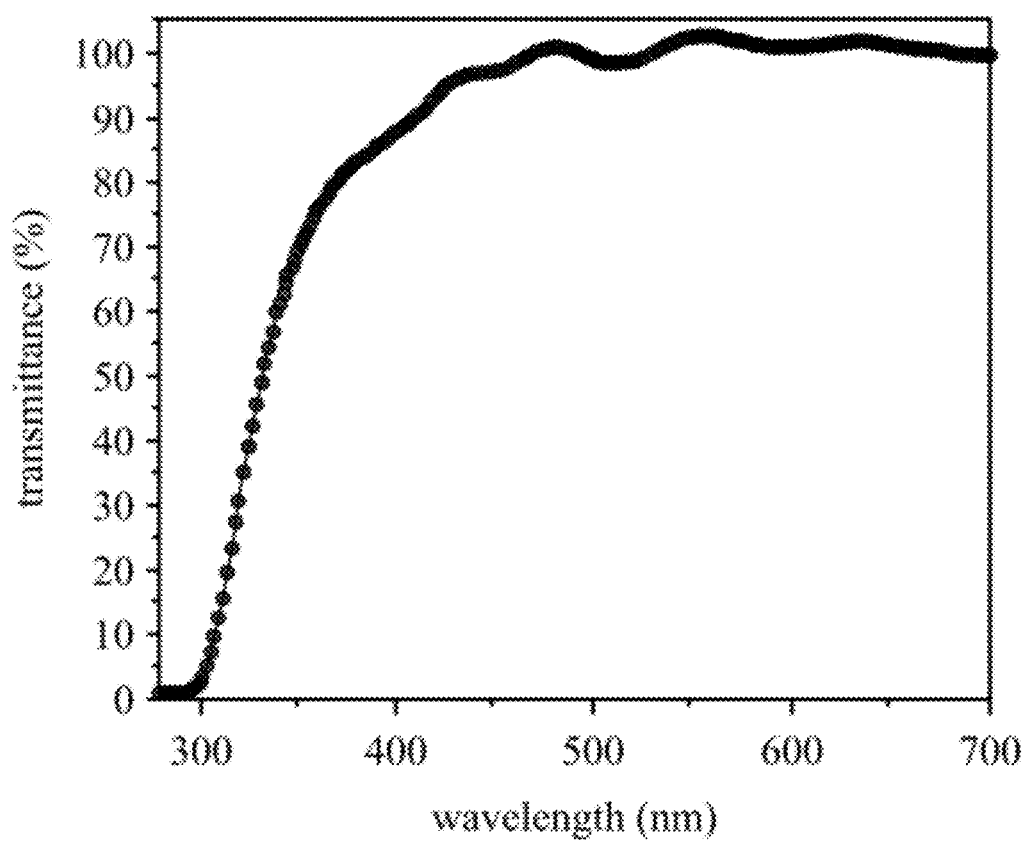
FIG. 7 is transmittance for the visible light of one embodiment of a flexible base material having three organic composite layers.

FIG. 7 is transmittance for the visible light of one embodiment of a flexible base material having three organic composite layers (formed by alternatively laminating the first organic layers and the second organic layers three times). As shown in FIG. 7, the transmittance for the visible light of one embodiment of a flexible base material having three organic composite layers is 95% and above. Therefore, the one embodiment of a flexible base material having three organic composite layers may be applied in a light emitting device package, for example, an OLED device, an optoelectronic display device or a thin film solar cell device.

Figure 3:
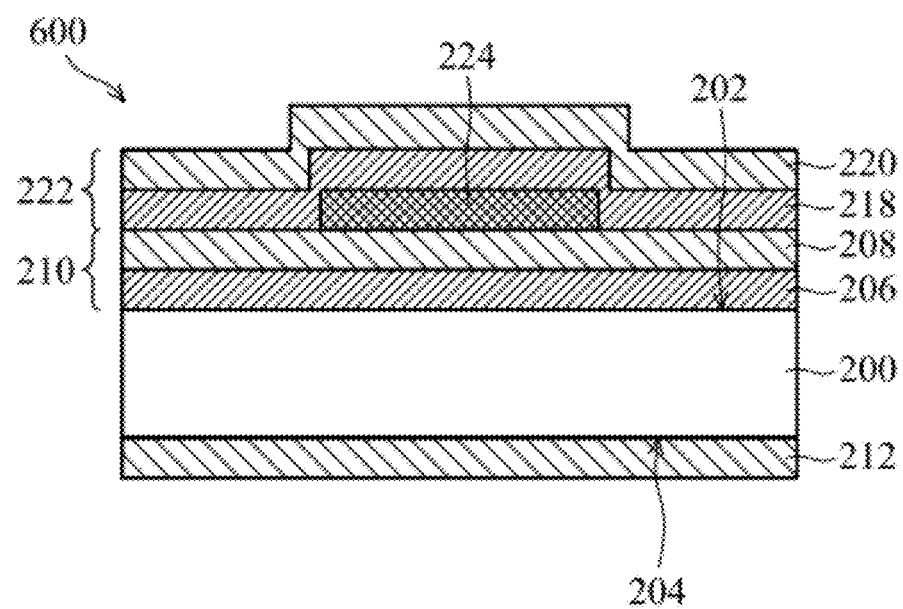
FIG. 3 is a cross section showing a flexible device formed by one exemplary embodiment of a flexible base material of the disclosure.

FIG. 3 is a cross section showing one exemplary embodiment of a flexible device 600 formed by the flexible base material 500a as shown in FIG. 1 or the flexible base material 500b as shown in FIG. 2. As shown in FIG. 3, the one exemplary embodiment of a flexible device 600 may further comprise a flexible electronic component 224 deposited on the organic composite barrier layer 210 and another organic composite barrier layer 222 deposited on the flexible electronic component 224 by encapsulating the flexible electronic component 224. In one embodiment, the flexible electronic component 224 may comprise an OLED device, an optoelectronic display device, a thin film solar cell device, a water/oxygen sensitive device or a metal of Ca, Mg or etc. In one embodiment, the organic composite barrier layer 222 may have the same materials and the same structural arrangement as the organic composite barrier layer 210. More specifically, the organic composite barrier layer 222 is an organic composite structure constructed by laminating a fifth organic layer 218 and a sixth organic layer 220 to the flexible electronic component 224, wherein the fifth organic layer 218 is disposed between the flexible electronic component 224 and the sixth organic layer 220. The fifth organic layer 218 has the same materials and thickness as the first organic layer 206. Also, the sixth organic layer 220 has the same materials and thickness as the second organic layer 208. As shown in FIG. 3, the organic composite barrier layer 210 under the flexible electronic component 224 can block the moisture from under the flexible substrate 200 and prevent it from penetrating into the flexible electronic component 224. Also, the organic composite barrier layer 222 above the flexible electronic component 224 can block the moisture from above the flexible substrate 200 or from the sides of the flexible substrate 200 and prevent it from penetrating into the flexible electronic component 224. A main function of the anti-curved layer 212a is to balance stresses generated during formation of the organic composite barrier layers 210 and 220. Therefore, the organic composite barrier layers 210 and 220 have good film quality. A resulting flexible device is prevented from being bent or deformed due to the internal stresses in the organic composite barrier layers. In one embodiment, the anti-curved layer 212 may comprise a signal layer structure of the anti-curved layer 212a as shown in FIG. 1 or a composite structure of the anti-curved layer 212b as shown in FIG. 2. In other embodiments, the number of the pair of the organic composite barrier layers comprising the organic composite barrier layers 210 and 220 is not limited to the numbers stated above, but according to design.

Embodiments provide a flexible base material having an organic composite barrier layer and an anti-curved layer, which are continuously growing in the same vacuum chamber. Therefore, the time for replacing and transmitting substrates for forming the barrier layers in different vacuum chambers for the conventional process can be reduced. Also, the stress generate from the organic composite barrier layer is cancelled off by more than 90% of the stress the stress generate from the anti-curved layer. Accordingly, one embodiment of a flexible base material can use a simple structure (constructed by, for example, an organic composite barrier layer constructed by a pair of organic layers and an anti-curved layer) to achieve the same moisture-barrier/gas-barrier performance as the conventional multi-layered barrier structure. Additionally, the transmittance for the visible light of one embodiment of a flexible base material is 95% and above. Also, one embodiment of a flexible base material has a good step coverage performance. Therefore, one embodiment of a flexible base material may be especially applied to fabrication processes of a flexible electronic device package, for example, a light emitting package, an OLED device, an optoelectronic display device or a thin film solar cell device.

While the embodiments have been described, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flexible base material, comprising:
   a flexible substrate having a first surface and a second surface opposite to the first surface;
   a first organic composite barrier layer deposited on the first surface of the flexible substrate, wherein the first organic composite barrier layer applies a first stress to the flexible substrate; and
   an anti-curved layer deposited on the second surface of the flexible substrate, wherein the anti-curved layer applies a second stress to the flexible substrate, and wherein the second stress applied by the anti-curved layer cancels off more than 90% of the first stress,
   wherein the first organic composite barrier layer comprises an organic material containing Si-$(CH_3)_x$ bond or Si-$(CH_2)_x$ bond, and wherein the anti-curved layer comprises silicon oxide ($SiO_x$), silicon nitride ($SiN_x$), and silicon oxynitride ($SiO_xN_y$), and
   wherein the first organic composite barrier layer comprises a first organic layer and a second organic layer, and the first organic layer is deposited between the flexible substrate and the second organic layer, wherein the first organic layer comprises an Si-O-Si bond and a ratio of the Si-O-Si bond to a Si-$(CH_3)_x$ bond is smaller than 1 or equal to 1, and wherein the second organic layer comprises an Si-O-Si bond and a ratio of the Si-O-Si bond to a Si-$(CH_3)_x$ bond is larger than 1.

2. The flexible base material as claimed in claim 1, wherein the flexible substrate comprises polyethylene terephthalate (PET), polyethersulfone (PES), polyethylene naphthalate (PEN), polyimide (PI) or polycarbonate (PC).

3. The flexible base material as claimed in claim 1, wherein the first organic layer has a thickness of about 1 nm ~10 μm.

4. The flexible base material as claimed in claim 1, wherein the second organic layer has a thickness of about 5 nm ~1 μm.

5. The flexible base material as claimed in claim 1, wherein the anti-curved layer has a thickness of about 5nm ~5 μm.

6. The flexible base material as claimed in claim 1, wherein a ratio of a thickness of the anti-curved layer to a thickness of the second organic layer is between 0.1 and 3.

7. A flexible electronic device, comprising:
   a flexible base material, comprising:
      a flexible substrate having a first surface and a second surface opposite to the first surface;
      a first organic composite barrier layer deposited on the first surface of the flexible substrate, wherein the first organic composite barrier layer applies a first stress to the flexible substrate; and
      an anti-curved layer deposited on the second surface of the flexible substrate, wherein the anti-curved layer applies a second stress to the flexible substrate, and wherein the second stress applied by the anti-curved layer cancels off more than 90% of the first stress;
   a flexible electronic component disposed on the first organic composite layer; and
   a second organic composite barrier layer disposed on the flexible electronic component, encapsulating the flexible electronic component,
   wherein the first organic composite barrier layer comprises an organic material containing Si-$(CH_3)_x$ bond or Si-$(CH_2)_x$ bond, and wherein the anti-curved layer comprises silicon oxide ($SiO_x$), silicon nitride ($SiN_x$), and silicon oxynitride ($SiO_xN_y$), and
   wherein the first organic composite barrier layer comprises a first organic layer and a second organic layer, and the first organic layer is deposited between the flexible substrate and the second organic layer, wherein the first organic layer comprises an Si-O-Si bond and a ratio of the Si-O-Si bond to a Si-$(CH_3)_x$ bond is smaller than 1 or equal to 1, and wherein the second organic layer comprises an Si-O-Si bond and a ratio of the Si-O-Si bond to a Si-$(CH_3)_x$ bond is larger than 1.

8. The flexible electronic device as claimed in claim 7, wherein the flexible electronic component comprises an organic light emitting diode device, an optoelectronic display device or a thin film solar cell device.

9. The flexible electronic device as claimed in claim 7, wherein the first organic composite barrier layer has the same materials as the second organic composite barrier layer.

* * * * *